United States Patent
Kawada et al.

(10) Patent No.: US 7,982,257 B2
(45) Date of Patent: Jul. 19, 2011

(54) SEMICONDUCTOR DEVICE AND METHOD OF MANUFACTURING THE SAME

(75) Inventors: Nobuhito Kawada, Yokohama (JP); Hiroshi Akahori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 12/339,440

(22) Filed: Dec. 19, 2008

(65) Prior Publication Data
US 2009/0166706 A1    Jul. 2, 2009

(30) Foreign Application Priority Data
Dec. 28, 2007    (JP) .................. 2007-340663

(51) Int. Cl.
*H01L 29/788* (2006.01)
(52) U.S. Cl. .. 257/316; 257/330; 257/506; 257/E27.103
(58) Field of Classification Search .................. 257/296, 257/316, 315, 330, 506, E29.3, E27.084, 257/E27.103
See application file for complete search history.

(56) References Cited

U.S. PATENT DOCUMENTS

| 5,986,302 A | 11/1999 | Fukatsu et al. | |
| 6,555,427 B1 * | 4/2003 | Shimizu et al. | 438/238 |
| 2005/0142765 A1 | 6/2005 | Joo | |

FOREIGN PATENT DOCUMENTS

| JP | 6-177392 | 6/1994 |
| JP | 6-310731 | 11/1994 |
| JP | 7-249697 | 9/1995 |
| JP | 9-232454 | 9/1997 |

OTHER PUBLICATIONS

H. Akahori, "Semiconductor Device and Method for Manufacturing the Same", U.S. Appl. No. 12/179,700, filed Jul. 25, 2008.

* cited by examiner

*Primary Examiner* — Matthew Smith
*Assistant Examiner* — Quovaunda Jefferson
(74) *Attorney, Agent, or Firm* — Finnegan, Henderson, Farabow, Garrett & Dunner, L.L.P.

(57) ABSTRACT

A semiconductor device according to an embodiment of the present invention has a bit line and a word line. The device includes a substrate which is provided with first trenches extending in a bit-line direction and has side surfaces forming sidewalls of the first trenches, the substrate being provided with bird's beaks at upper edges of the side surfaces, a first gate insulator formed on the substrate between the first trenches, a floating gate formed on the first gate insulator between the first trenches and located between second trenches extending in a word-line direction, the floating gate not being provided with bird's beaks at lower edges of side surfaces facing the first trenches, a second gate insulator formed on the floating gate between the second trenches, and a control gate formed on the second gate insulator between the second trenches.

6 Claims, 13 Drawing Sheets

SEMICONDUCTOR DEVICE AND METHOD OF MANUFACTURING THE SAME

CROSS REFERENCE TO RELATED APPLICATIONS

This application is based upon and claims the benefit of priority from the prior Japanese Patent Application No. 2007-340663, filed on Dec. 28, 2007, the entire contents of which are incorporated herein by reference.

BACKGROUND OF THE INVENTION

1. Field of the Invention

The present invention relates to a semiconductor device and a method of manufacturing the same.

2. Background Art

In general, a memory cell of a flash memory includes a substrate, a first gate insulator, a floating gate, a second gate insulator, and a control gate. The first gate insulator is often called tunnel insulator, and the second gate insulator is often called interlayer dielectric or interpoly dielectric.

The flash memory has a problem in that an electric field tends to concentrate on edges of an interface between the substrate and the first gate insulator and on edges of an interface between the first gate insulator and the floating gate. This is because the electric field tends to concentrate on sharp portions. The flash memory also has a problem in that an electric current tends to flow locally in edges of the first gate insulator. This is because an amount of an FN current flowing through the first gate insulator mainly depends on the electric field.

When the electric current flows locally in the first gate insulator, electron traps tend to occur in the first gate insulator. Detraps of trapped electrons are equivalent to removal of electrons from the floating gate. Therefore, when electron detraps occur, threshold voltage of the memory cell fluctuates. This makes it difficult to maintain a charge holding characteristic of the memory cell. Moreover, when miniaturization of the flash memory advances, an amount of electrons held by the floating gate decreases. Therefore, when the flash memory is miniaturized, influence of electron detraps on the threshold voltage increases. Therefore, when miniaturizing the flash memory, it is necessary to prevent the concentration of the electric field on the edges of the substrate and the floating gate.

The electric field concentration on these edges can be prevented by forming bird's beaks at the edges so as to round the edges (JP-A H6-310731 (KOKAI)). Such bird's beaks can be formed by oxidizing surfaces of sidewalls of a shallow trench after the shallow trench is formed. Thereby, the bird's beaks are formed at the edges of the substrate and the floating gate. However, such bird's beaks cause a decrease and variation of the capacitance of the first gate insulator.

Methods for solving this problem are disclosed in JP-A H7-249697 (KOKAI), JP-A H6-177392 (KOKAI), and JP-A H9-232454 (KOKAI). According to the method in JP-A H7-249697, an oxidization amount of the edges is controlled by giving a density gradient to doping density of the floating gate. According to the methods in JP-A H6-177392 (KOKAI) and JP-A H9-232454 (KOKAI), formation of bird's beaks is suppressed by adding an oxidization preventing substance to the first gate insulator. However, if formation of bird's beaks is suppressed by these methods, the problem of the local flow of the electric current in the first gate insulator cannot be solved.

The floating gate is often formed of polysilicon. Usually, an oxide layer formed by oxidizing the polysilicon contains a large number of traps. When an electric current flows in such oxide layer, electron traps tend to easily occur. Such electron traps increase electron detraps from the first gate insulator. Therefore, it is desirable to suppress the oxidization of the polysilicon as much as possible.

SUMMARY OF THE INVENTION

An aspect of the present invention is, for example, a semiconductor device having a bit line and a word line, the device including a substrate which is provided with first trenches extending in a bit-line direction and has side surfaces forming sidewalls of the first trenches, the substrate being provided with bird's beaks at upper edges of the side surfaces, a first gate insulator formed on the substrate between the first trenches, a floating gate formed on the first gate insulator between the first trenches and located between second trenches extending in a word-line direction, the floating gate not being provided with bird's beaks at lower edges of side surfaces facing the first trenches, a second gate insulator formed on the floating gate between the second trenches, and a control gate formed on the second gate insulator between the second trenches.

Another aspect of the present invention is, for example, a method of manufacturing a semiconductor device having a bit line and a word line, the method including forming a first gate insulator on a substrate, forming a floating gate layer on the first gate insulator, processing the floating gate layer, the first gate insulator, and the substrate to form first trenches extending in a bit-line direction, forming bird's beaks in the substrate at upper edges of side surfaces forming sidewalls of the first trenches, embedding an insulator in the first trenches, forming a second gate insulator on the floating gate layer, forming a control gate layer on the second gate insulator, and processing the control gate layer, the second gate insulator, and the floating gate layer to form second trenches extending in a word-line direction.

BRIEF DESCRIPTION OF THE DRAWINGS

FIGS. 5(A) to 9(B) illustrate a manufacturing process of the semiconductor device according to the embodiment;

DESCRIPTION OF THE EMBODIMENTS

Embodiments of the present invention are explained below with reference to the accompanying drawings.

Figure 1:
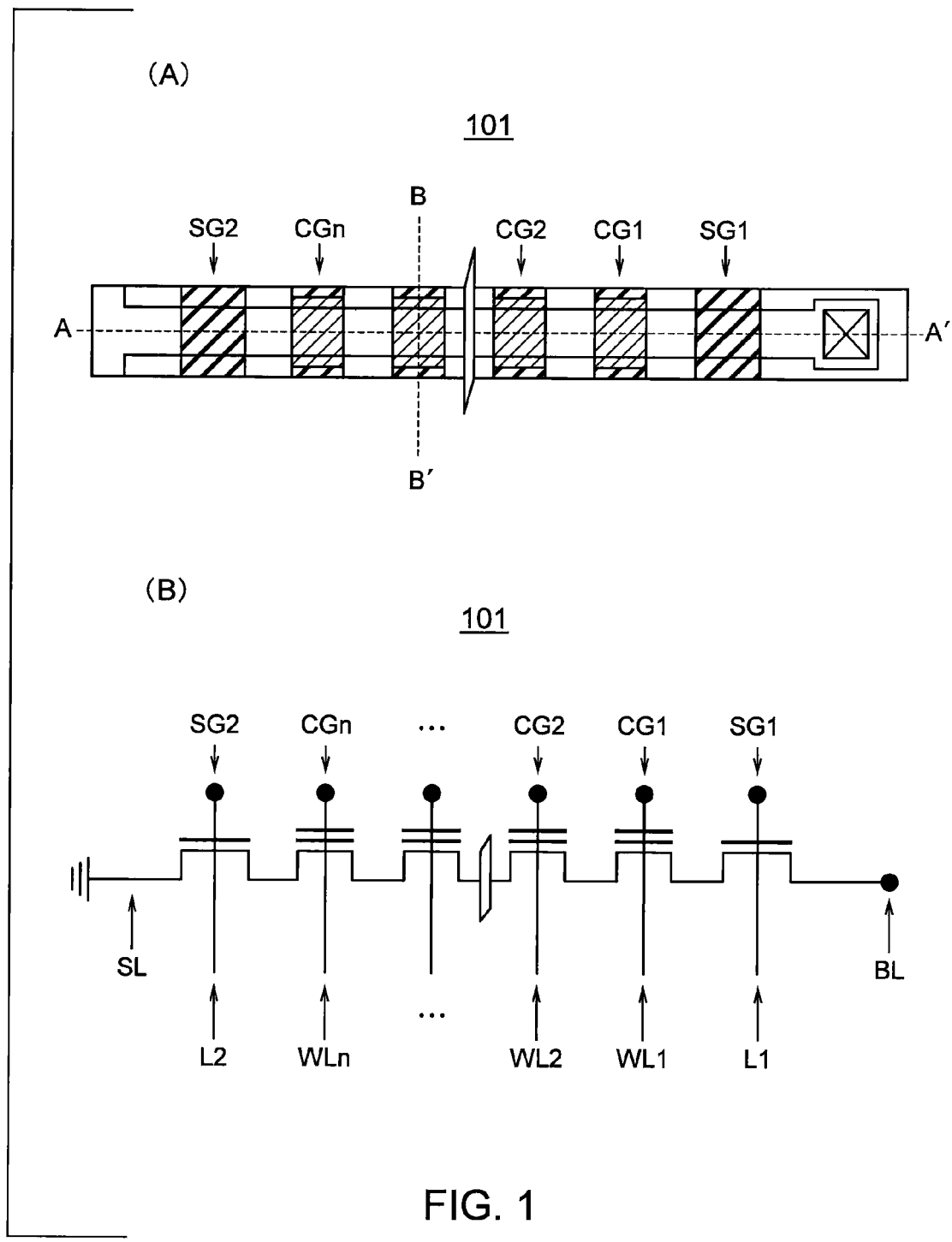
FIGS. 1(A) and 1(B) are a plan view and a sectional view showing a cell array structure of a semiconductor device according to an embodiment of the present invention.

FIGS. 1(A) and 1(B) a plan view and a sectional view of a cell array structure of a semiconductor device 101 according to an embodiment of the present invention. The semiconductor device 101 in this embodiment is a nonvolatile semiconductor storage device, more specifically, a NAND type flash memory. The semiconductor device 101 may be another type of flash memory.

FIGS. 1(A) and 1(B) show cell transistors CG1 to CGn. These cell transistors are N-channel MOSFETs, and are connected in series in order of CG1, CG2, . . . , and CGn. A drain of the cell transistor CG1 is connected to a bit line BL via a selection transistor SG1. A source of the cell transistor CGn is connected to a source line SL via a selection transistor SG2.

The cell transistors and selection transistors are formed on an identical well substrate. Gates (control gates) of the cell transistors CG1 to CGn are connected to word lines WL1 to WLn, respectively. Gates (control gates) of the selection transistors SG1 and SG2 are connected to the selection lines L1 and L2, respectively.

The semiconductor device 101 includes plural bit lines (BL and the like) and plural word lines (WL1 to WLn). The bit lines extend in an A-A' line direction in FIG. 1(A). The word lines extend in a B-B' line direction in FIG. 1(A). In this way, the A-A' line direction in FIG. 1(A) is a bit-line direction (a direction parallel to the bit lines), and the B-B' line direction in FIG. 1(A) is a word-line direction (a direction parallel to the word lines).

Figure 2:
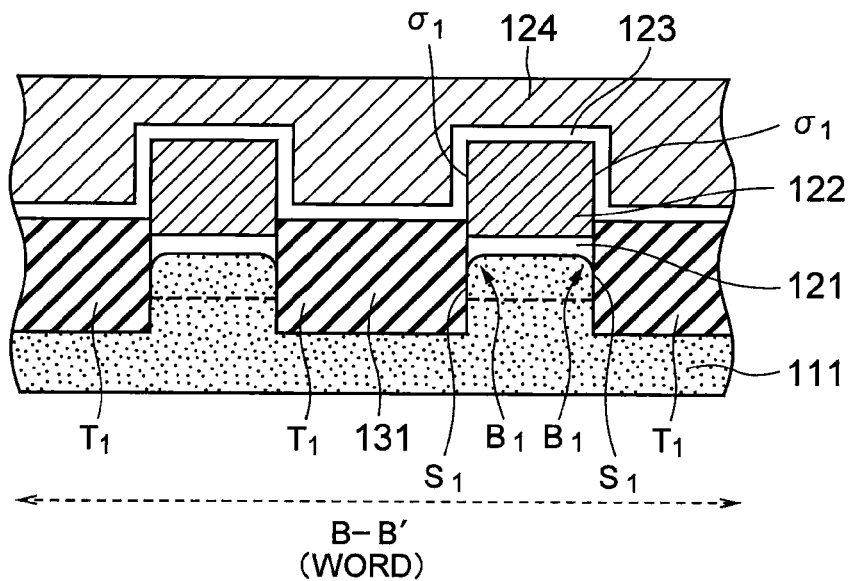
FIG. 2 is a side sectional view of the semiconductor device according to the embodiment.

FIG. 2 is a side sectional view of the semiconductor device 101 according to this embodiment. FIG. 2 is a sectional view on the B-B' line shown in FIG. 1(A). The semiconductor device 101 includes a substrate 111, a first gate insulator 121, a floating gate 122, a second gate insulator 123, a control gate 124, and an embedded insulator 131.

The substrate 111 in this embodiment is a semiconductor substrate, more specifically, a silicon substrate. The substrate 111 may be an SOI (Semiconductor On Insulator) substrate, which includes a semiconductor substrate (e.g., a silicon substrate), an insulator (e.g., a silicon insulator) formed on the semiconductor substrate, and a semiconductor layer (e.g., a silicon layer) formed on the insulator. Plural trenches $T_1$ extending in the bit-line direction are provided on the substrate 111. The trenches $T_1$ are an example of first trenches. As shown in FIG. 2, the substrate 111 has side surfaces forming sidewalls of the trenches $T_1$. In FIG. 2, the side surfaces of the substrate 111 are indicated by $S_1$. In this embodiment, bird's beaks $B_1$ are formed at upper edges of the side surfaces $S_1$.

The first gate insulator 121 is formed on the substrate 111 between the trenches $T_1$, and is in contact with an upper surface of the substrate 111. In general, the first gate insulator 121 is called tunnel insulator. The first gate insulator 121 in this embodiment is a silicon oxide nitride layer.

The floating gate 122 is formed on the first gate insulator 121 between the trenches $T_1$, and is in contact with an upper surface of the gate insulator 121. The floating gate 122 functions as an electrode for holding charges. The floating gate 122 in this embodiment is a polysilicon layer. As shown in FIG. 2, the floating gate 122 has side surfaces facing the trenches $T_1$. In FIG. 2, the side surfaces of the floating gate 122 are indicated by $\sigma_1$. In this embodiment, bird's beaks are not formed at lower edges of the side surfaces $\sigma_1$.

The second gate insulator 123 is formed on the floating gate 122, and is in contact with an upper surface of the floating gate 122 and side surfaces of the floating gate 122 on the trenches $T_1$ sides. In general, the second gate insulator 123 is called interlayer dielectric or interpoly dielectric. The second gate insulator 123 in this embodiment is a laminated insulator (ONO insulator) including a lower silicon oxide layer, a silicon nitride layer, and an upper silicon oxide layer.

The control gate 124 is formed on the second gate insulator 123, and is in contact with an upper surface of the second gate insulator 123 and side surfaces of the second gate insulator 123 on the trenches $T_1$ sides. The control gate 124 functions as a control electrode. The control gate 124 in this embodiment is a polysilicon layer.

The embedded insulator 131 is embedded in the trenches $T_1$, and covers upper edges of the side surfaces $S_1$ and lower edges of the side surfaces $\sigma_1$. In general, the embedded insulator 131 is called STI (Shallow Trench Isolation) layer. The embedded insulator 131 in this embodiment is a silicon oxide layer.

Figure 3:
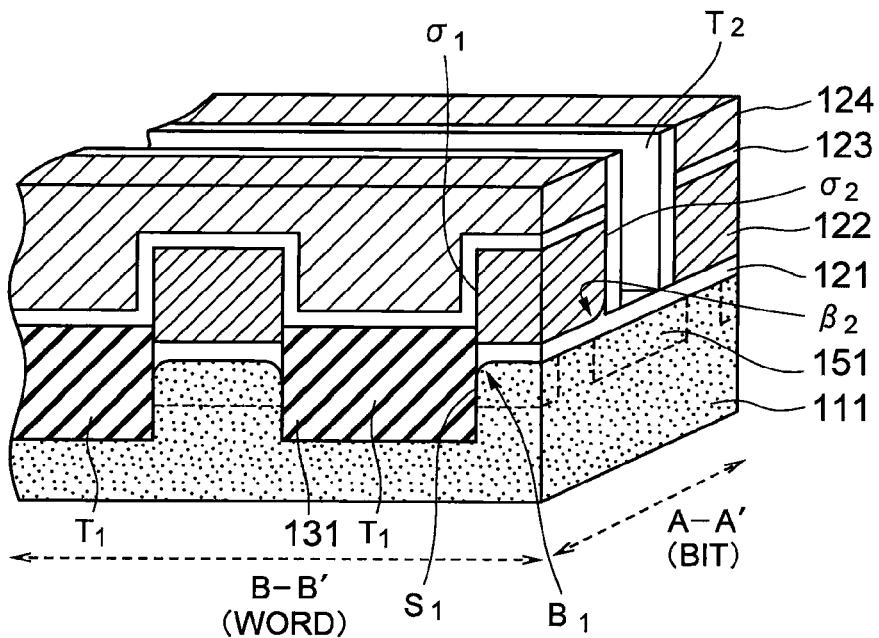
FIG. 3 is a projected sectional view of the semiconductor device according to the embodiment.
Figure 4:
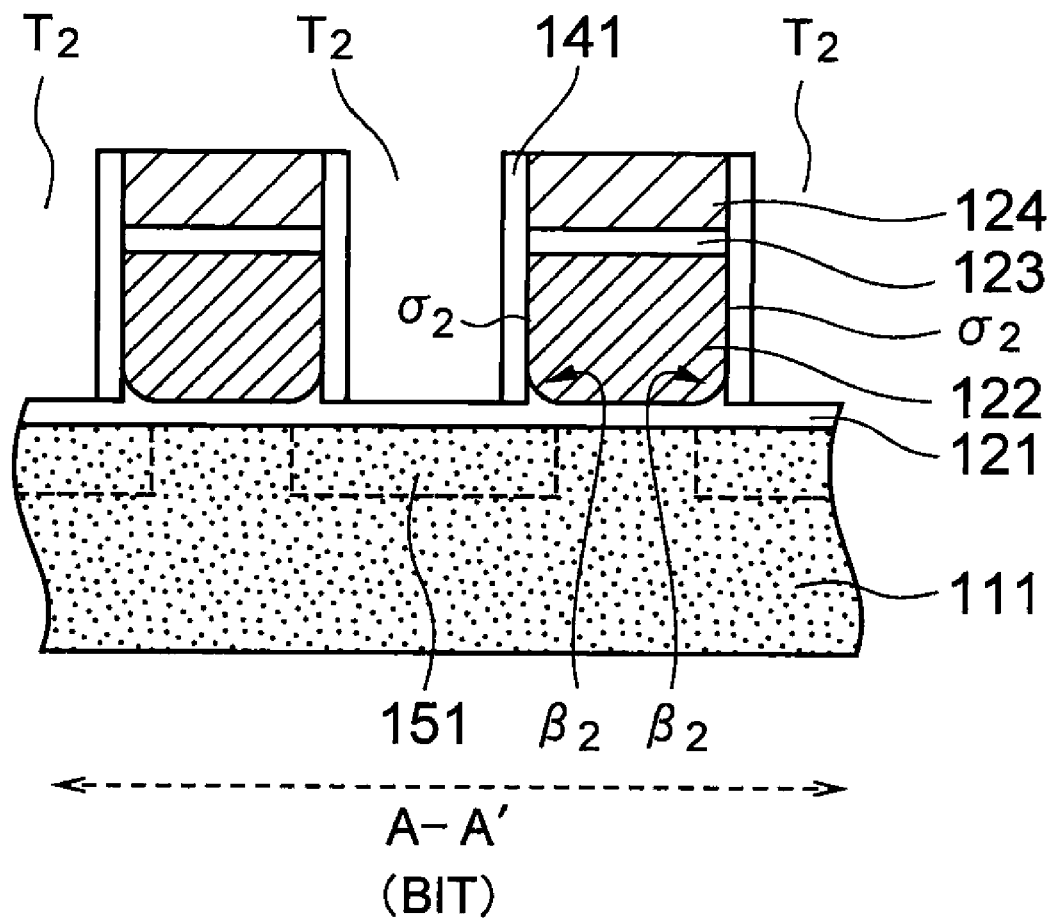
FIG. 4 is a side sectional view of the semiconductor device according to the embodiment.
Figure 5:
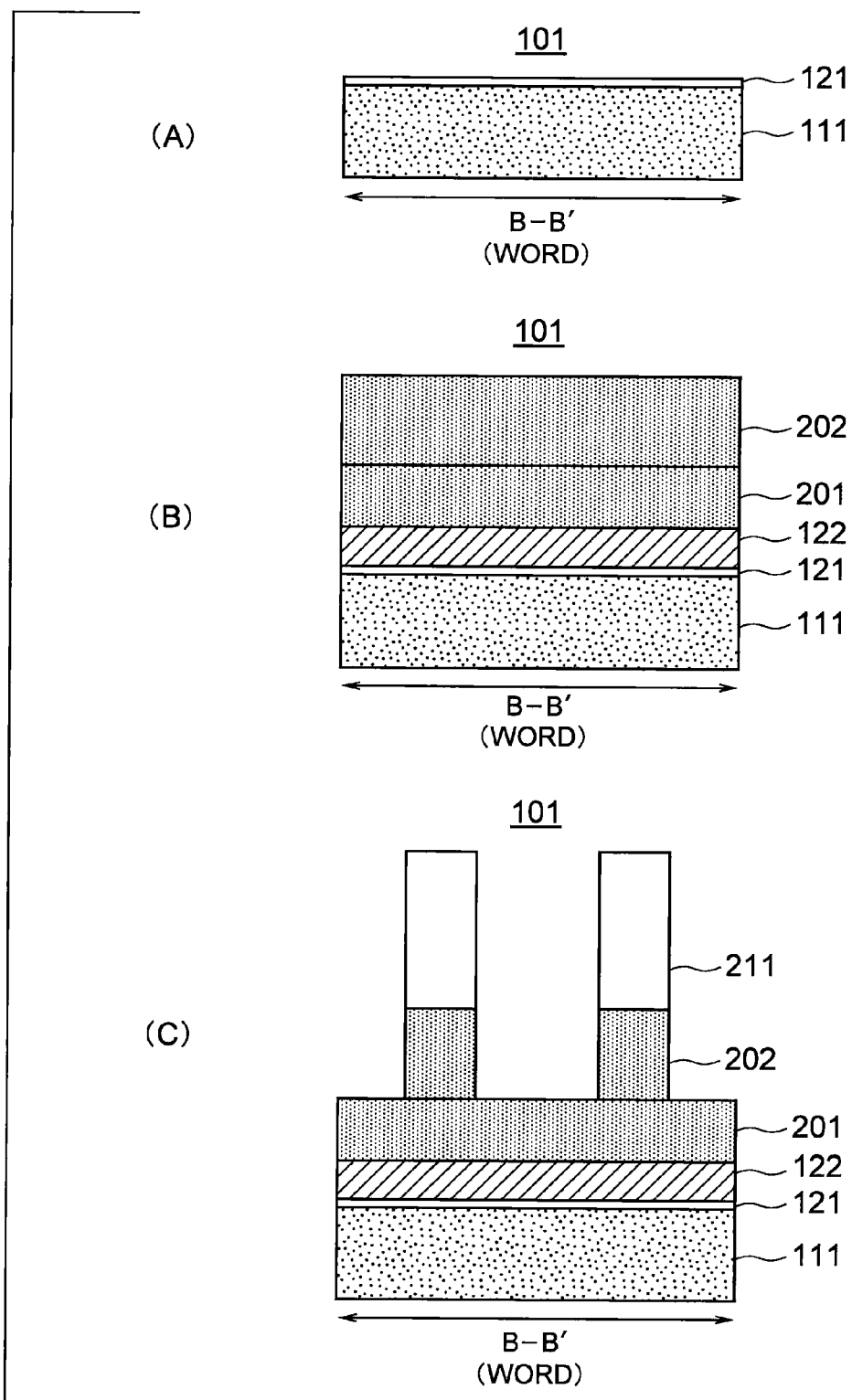

A projected sectional view and a side sectional view of the semiconductor device 101 are shown in FIGS. 3 and 4, respectively. FIG. 3 is a sectional view on the A-A' line and the B-B' line shown in FIG. 1(A). FIG. 4 is a sectional view on the A-A' line shown in FIG. 1(A). The semiconductor device 101 further includes a post-oxide layer (a sidewall insulator) 141 and an active region 151.

As shown in FIGS. 3 and 4, plural trenches $T_2$ extending in the word-line direction are provided in the semiconductor device 101. The trenches $T_2$ are an example of second trenches.

The first gate insulator 121 forms a bottom surface of the trenches $T_2$. The trenches $T_2$ are located above the active region 151 formed in the substrate 111. The first gate insulator 121 is interposed between the trenches $T_2$ and the active region 151.

The floating gate 122 is formed on the first gate insulator 121 between the trenches $T_2$. As shown in FIGS. 3 and 4, the floating gate 122 has side surfaces facing the trenches $T_2$. In FIGS. 3 and 4, the side surfaces of the floating gate 122 are indicated by $\sigma_2$. In this embodiment, bird's beaks $\beta_2$ are formed at lower edges of the side surfaces $\sigma_2$. In FIGS. 3 and 4, the side surfaces $\sigma_2$ are covered with the post-oxide layer 141. The post-oxide layer 141 in this embodiment is a silicon oxide layer.

The second gate insulator 123 is formed on the floating gate 122 between the trenches $T_2$. In FIGS. 3 and 4, side surfaces of the second gate insulator 123 on the trenches $T_2$ sides are covered with the post-oxide layer 141.

The control gate 124 is formed on the second gate insulator 123 between the trenches $T_2$. In FIGS. 3 and 4, side surfaces of the control gate 124 on the trenches $T_2$ sides are covered with the post-oxide layer 141.

Figure 8:
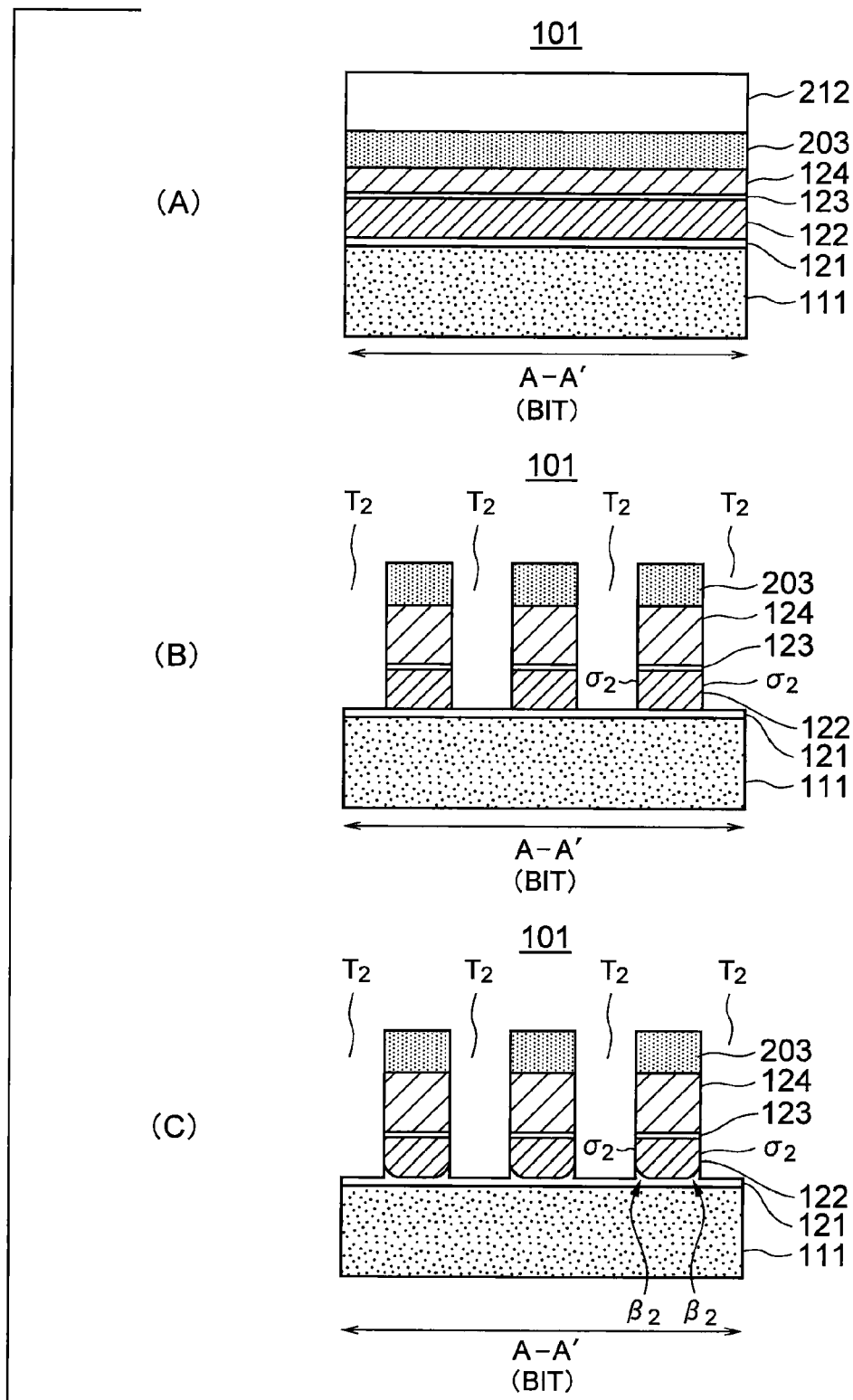
Figure 9:
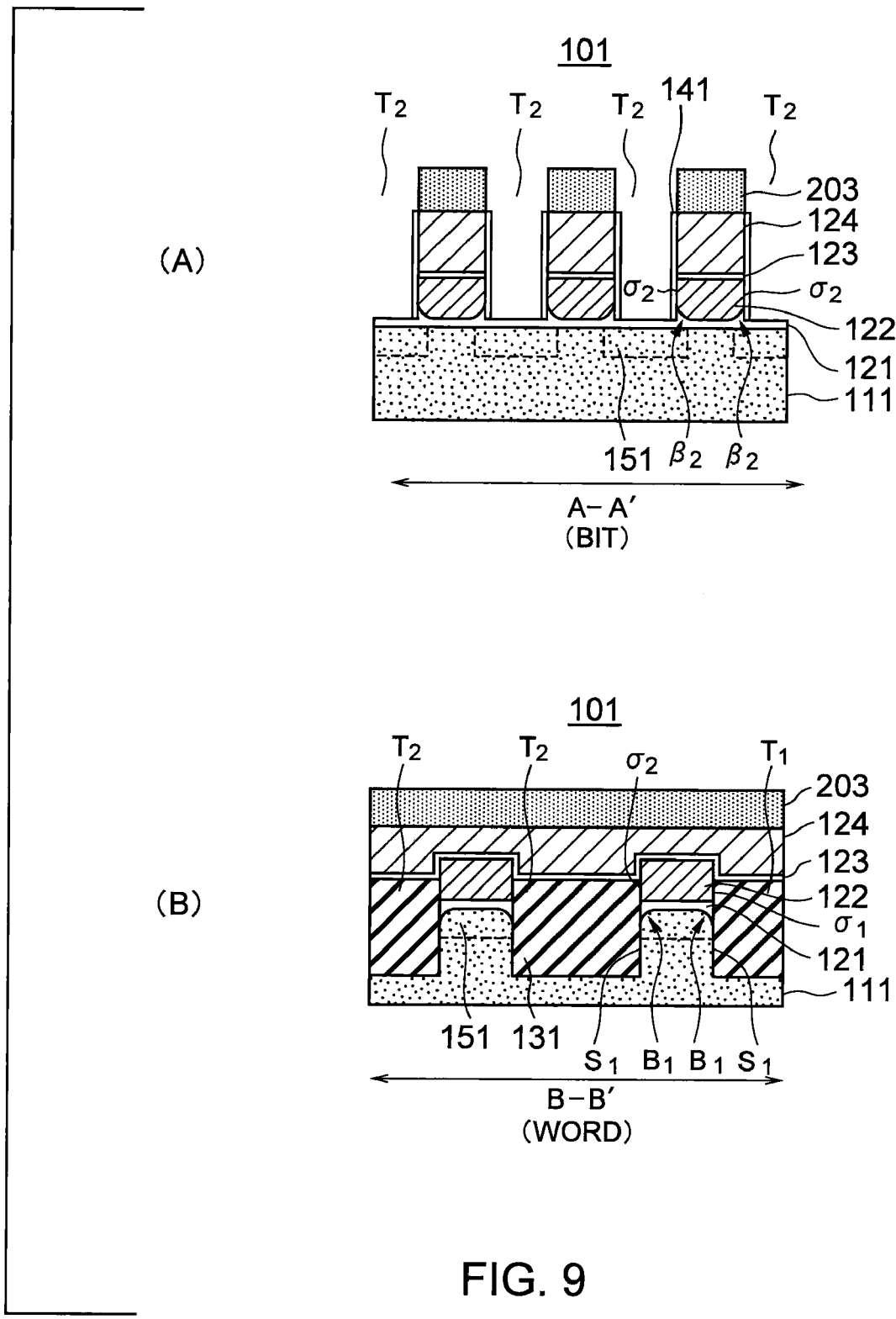

FIGS. 5(A) to 9(B) illustrate a manufacturing process of the semiconductor device 101 according to this embodiment. FIGS. 5(A) to 7(C) are sectional views on the B-B' line shown in FIG. 1(A). FIGS. 8(A) to 9(A) are sectional views on the A-A' line shown in FIG. 1(A). FIGS. 9(B) is a sectional view on the B-B' line shown in FIG. 1(A).

First, a first gate insulator 121 as a silicon oxide nitride layer is formed on a substrate 111 (FIG. 5(A)). The substrate 111 is a silicon substrate. The first gate insulator 121 is formed by forming a silicon oxide layer on the substrate 111 by thermal oxidization, and nitriding the silicon oxide layer using an $NH_3$ gas.

Next, a floating gate layer 122 as a polysilicon layer is deposited on the first gate insulator 121 by CVD. Next, a mask layer (first mask layer) 201 as a silicon nitride layer is deposited on the floating gate layer 122 by CVD. Next, a mask layer (second mask layer) 202 as an oxide layer is deposited on the mask layer 201 by CVD (FIG. 5(B)).

Next, a photoresist 211 is applied on the mask layer 202. Next, the mask layer 202 is processed by lithography (FIG. 5(C)).

Next, the photoresist 211 is removed. Next, the mask layer 201, the floating gate layer 122, the first gate insulator 121, and the substrate 111 are processed by RIE (FIG. 6(A)). Thereby, plural trenches $T_1$ extending in the bit-line direction are formed. In FIG. 6(A), side surfaces of the substrate 111 forming sidewalls of the trenches $T_1$ are indicated by $S_1$, and side surfaces of the floating gate layer 122 exposed to the trenches $T_1$ are indicated by $\sigma_1$. Both the side surfaces $S_1$ and the side surfaces $\sigma_1$ form sidewalls of the trenches $T_1$.

Next, sidewall surfaces of the trenches $T_1$ are oxidized (FIG. 6(B)). Thereby, bird's beaks are formed on the sidewall surfaces of the trenches $T_1$. The oxidization is performed by a method with which bird's beaks are formed at upper edges of the side surfaces $S_1$ and are not formed at lower edges of the side surfaces $\sigma_1$. In other words, bird's beaks are formed at the upper edges of the side surfaces $S_1$ by a method with which formation of bird's beaks at the lower edges of the side surfaces $\sigma_1$ is limited. Thereby, as shown in FIG. 6(B), bird's beaks $B_1$ are formed at the upper edges of the side surfaces $S_1$, and bird's beaks are not formed at the lower edges of the side surfaces $\sigma_1$. An example of such a method is explained later.

An oxidization process shown in FIG. 6(B) is explained below.

Figure 10:
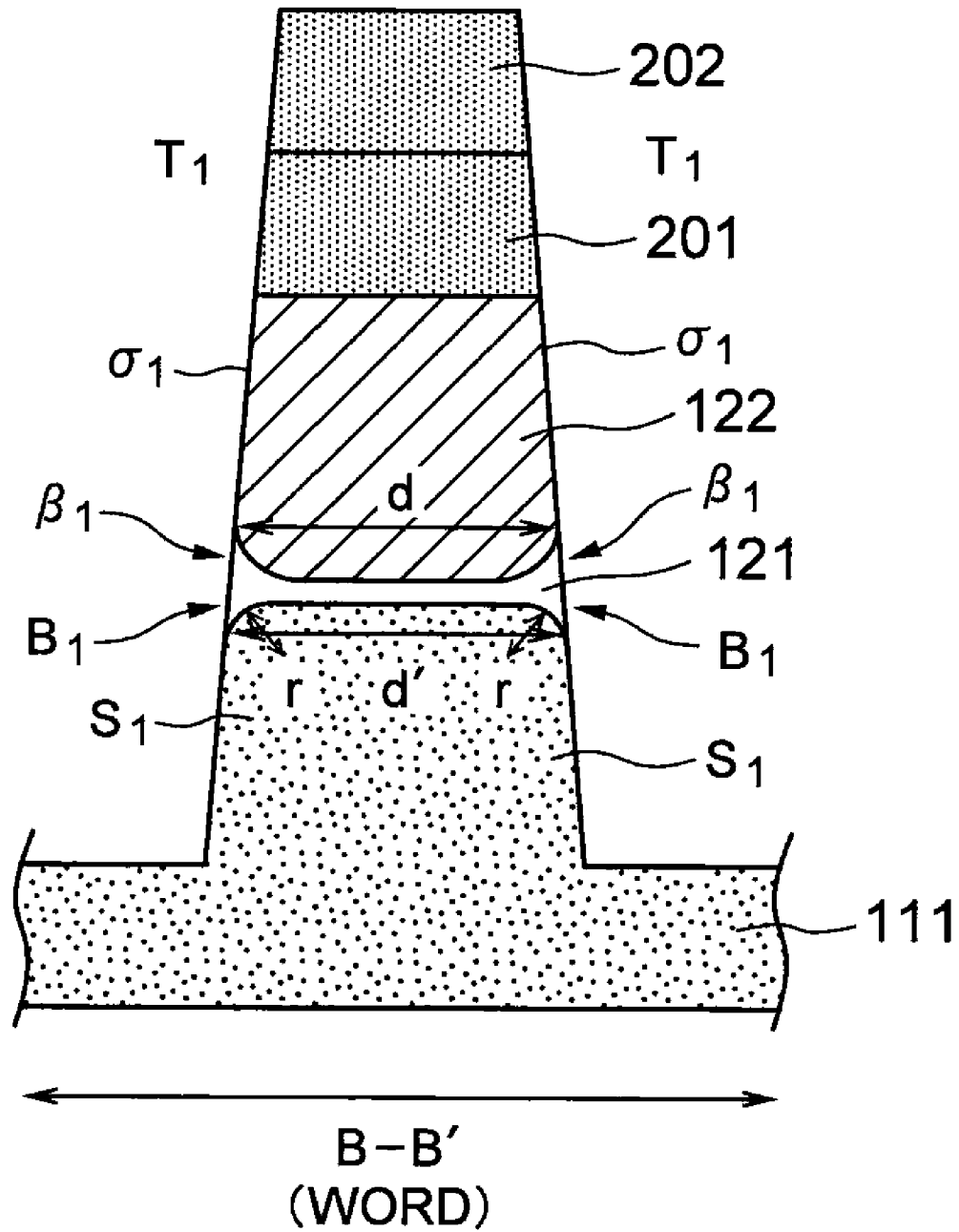
FIG. 10 is a drawing for explaining oxidization of a floating gate layer.

The oxidization process shown in FIG. 6(B) is performed for recovery from damage caused in the first gate insulator 121 by RIE (Reactive Ion Etching) and for field relaxation by forming bird's beaks. However, it is not preferable that the floating gate layer 122 is oxidized by the oxidization process. Nevertheless, if it is attempted to form bird's beaks on the sidewall surfaces of the trenches $T_1$, usually, the floating gate layer 122 is also oxidized as shown in FIG. 10. FIG. 10 shows bird's beaks $\beta_1$ formed at the lower edges of the side surfaces $\sigma_1$. When the floating gate layer 122 is a polysilicon layer, the oxidization of the floating gate layer 122 increases electron detraps from the first gate insulator 121. Polysilicon (polycrystal silicon) has a characteristic that its oxidization rate is higher than that of monocrystal silicon and increases with doping density. Therefore, when the floating gate layer 122 is a polysilicon layer, the floating gate layer 122 is more easily oxidized than the substrate 111.

In this embodiment, the trenches $T_1$ are formed by RIE. Therefore, in this embodiment, as shown in FIG. 10, width "d" is larger than width "d'" (i.e., d'>d). Here, "d" represents the width of a lower surface of the floating gate 122 in a side section in the word-line direction. Further, "d'" represents the width of an upper surface of the substrate 111 (active region 151) in the side section in the word-line direction. According to electric field simulation and experiments, in the case of d'>d, an electric field concentrates on the upper edges of the side surfaces $S_1$ during writing and erasing. Therefore, in the oxidization process shown in FIG. 6(B), the upper edges of the side surfaces $S_1$ are oxidized such that the lower edges of the side surfaces $\sigma_1$ are not oxidized. In this way, in this embodiment, the field relaxation is realized while oxidization of the floating gate layer 122 is prevented.

Figure 11A:
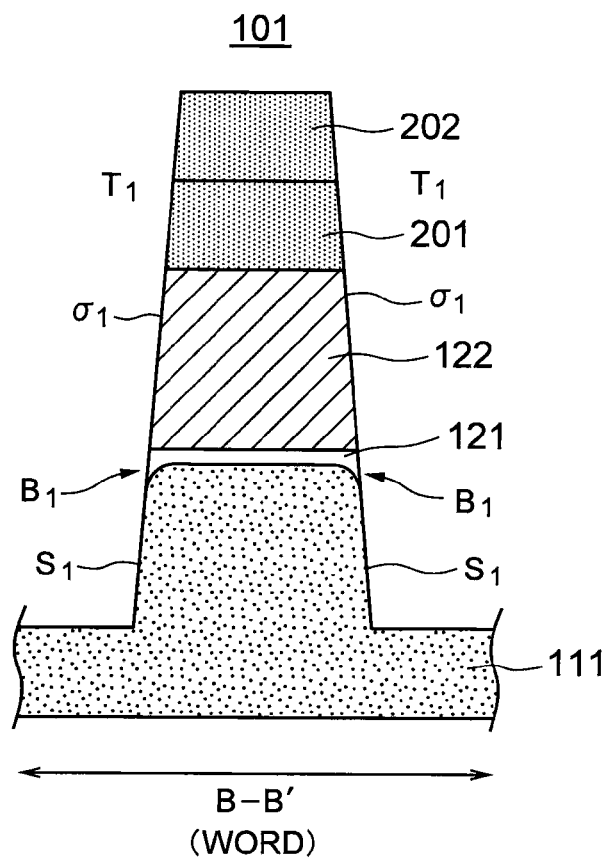
FIG. 11A is a drawing for explaining a first example of an oxidization process shown in FIG. 6(B)

A first example of the method of oxidizing only the upper edges of the side surfaces $S_1$ is bias oxidization. In the bias oxidization, DC or AC bias is applied to the substrate 111 to selectively make oxygen chemical species in plasma to incident on the substrate 111. With the bias oxidization, it is possible to selectively oxidize the substrate 111, by oxidizing the substrate 111 with oxygen plasma while applying positive DC bias, negative DC bias, or AC bias to the substrate 111. The oxygen plasma contains, for example, positively charged oxygen molecules and negatively charged oxygen atoms. The frequency of the AC bias is set to, for example, 13.56 MHz. For example, the AC bias is applied to the substrate 111 to apply self bias to the substrate 111. The substrate 111 applied with the self bias attracts positively charged oxygen molecules. An example of an oxide layer (bird's beaks $B_1$) formed by the bias oxidization is shown in FIG. 11A. In the bias oxidization, an oxidization amount increases with oxidization time. In the bias oxidization, it is possible to control anisotropy of oxidization by controlling bias voltage.

Figure 11B:
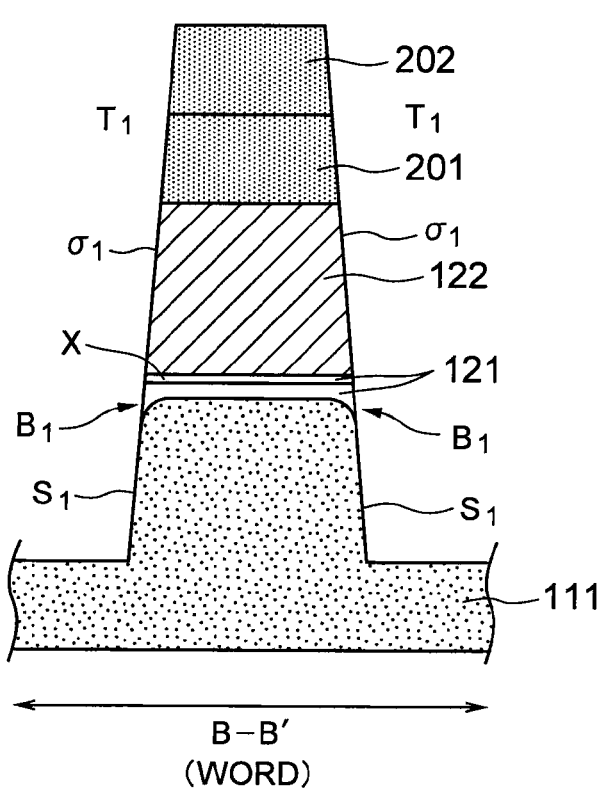
FIG. 11B is a drawing for explaining a second example of the oxidization process shown in FIG. 6(B)

A second example of the method of oxidizing only the upper edges of the side surfaces $S_1$ is a combination of radical nitriding and radical oxidization. In this method, first, an upper surface of the first gate insulator 121 is radically nitrided by SPA (Slot Plane Antenna) between the process shown in FIG. 5(A) and the process shown in FIG. 5(B). Thereby, a silicon nitride layer is formed on the surface of the first gate insulator 121. The floating gate layer 122 is deposited on the silicon nitride layer formed on the surface of the first gate insulator 121. Next, the sidewall surfaces of the trenches $T_1$ are radically oxidized in the process shown in FIG. 6(B). In the radical oxidization, the silicon nitride layer prevents oxidizing species from entering the floating gate layer 122 and suppresses oxidization of the floating gate layer 122. Thereby, the substrate 111 is selectively oxidized. An example of an oxide layer (bird's beaks $B_1$) formed by the radical nitriding and radical oxidization is shown in FIG. 11B. In FIG. 11B, the silicon nitride layer is indicated by X. The oxidization may be oxidization other than the radical oxidization (e.g., thermal oxidization).

Figure 6:
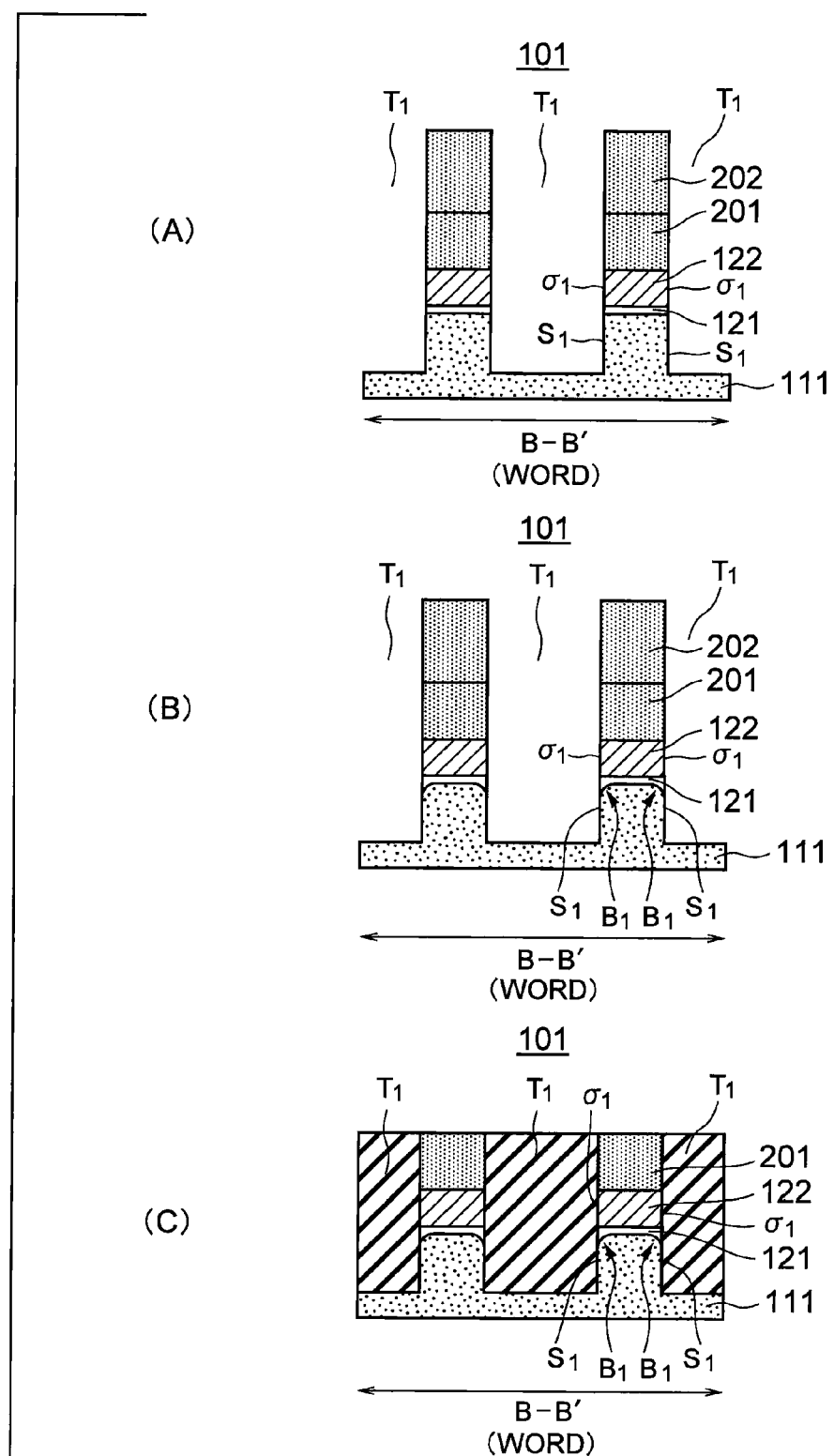
Figure 7:
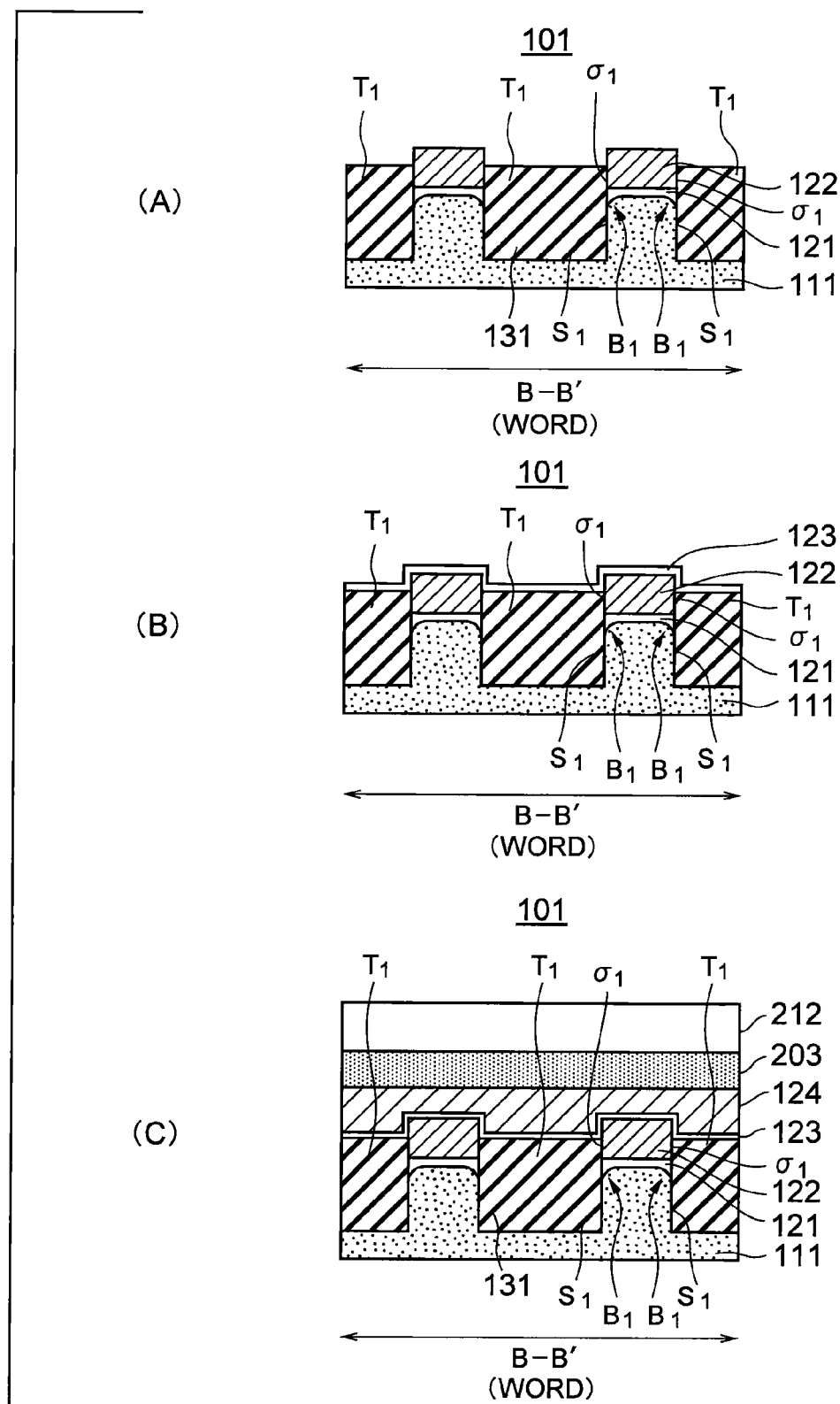

In the manufacturing process shown in FIGS. 5(A) to 9(B), it is assumed that the oxidization process shown in FIG. 6(B) is performed by the bias oxidization. Referring back to FIG. 6(B), the explanation is continued.

Next, an insulator 131 is deposited in the trenches $T_1$ by plasma CVD. The insulator 131 in this embodiment is a silicon oxide layer. Next, the insulator 131 is planarized by CMP (chemical mechanical polishing) until an upper surface of the mask layer 201 is exposed. In this way, the insulator 131 is embedded in the trenches $T_1$ (FIG. 6(C)).

Next, the height of an upper surface of the embedded insulator 131 is reduced by etching. Thereby, the side surfaces of the floating gate layer 122 are partially exposed. Next, the mask layer 201 is peeled by wet treatment. Thereby, an upper surface of the floating gate layer 122 is exposed (FIG. 7(A)).

Next, a second gate insulator 123 as a laminated insulator (ONO insulator) is deposited on the floating gate layer 122 (FIG. 7(B)). The second gate insulator 123 is formed by depositing a lower silicon oxide layer on the floating gate layer 122, depositing a silicon nitride layer on the lower silicon oxide layer, and depositing an upper silicon oxide layer on the silicon nitride layer.

Next, a control gate layer 124 as a polysilicon layer is deposited on the second gate insulator 123 by LPCVD. Next, a mask layer 203 as a silicon nitride layer is deposited on the control gate layer 124 by LPCVD. Next, a photoresist 212 is applied on the mask layer 203 (FIG. 7(C)). As explained above, FIG. 7(C) is a B-B' sectional view. An A-A' sectional view at the stage of FIG. 7(C) is shown in FIG. 8(A).

Next, the mask layer 203 is processed by lithography. Next, the photoresist 212 is removed. Next, the control gate layer 124, the second gate insulator 123, and the floating gate layer 122 are processed by RIE (FIG. 8(B)). Thereby, plural trenches T₂ extending in the word-line direction are formed. In FIG. 8(B), side surfaces of the floating gate layers 122 exposed to the trenches T₂ are indicated by σ₂.

Next, sidewall surfaces of the trenches T₂ are oxidized (FIG. 8(C)). Thereby, bird's beaks are formed on the sidewall surfaces of the trenches T₂. The oxidization is performed by a method with which bird's beaks are formed at lower edges of the side surfaces σ₂. Thereby, as shown in FIG. 8(C), the bird's beaks β₂ are formed at the lower edges of the side surfaces σ₂. An example of such a method is explained later.

The oxidization process shown in FIG. 8(C) is explained below.

In this embodiment, the trenches T₂ are formed by RIE. According to electric field simulation and experiments, in this case, an electric field concentrates on the lower edges of the side surfaces σ₂ during erasing. Therefore, in the oxidization process shown in FIG. 8(C), the lower edges of the side surfaces σ₂ are oxidized. Thereby, the bird's beaks β₂ are formed at the lower edges of the side surfaces σ₂, and the electric field concentration on the lower edges of the side surfaces σ₂ is relaxed.

Figure 11C:
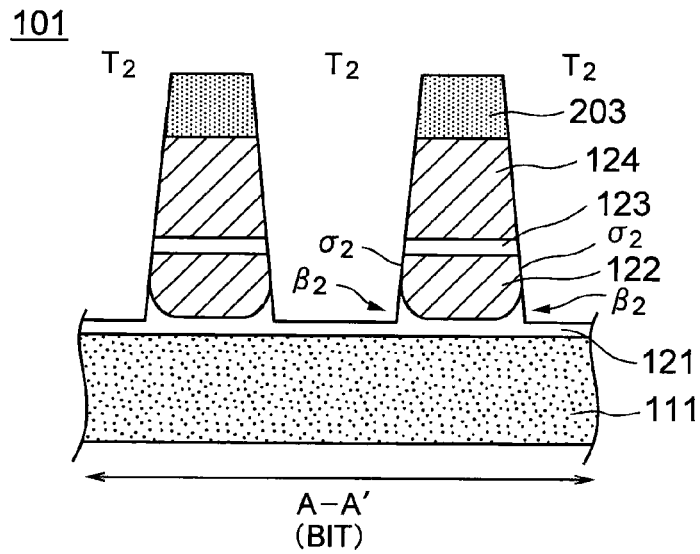
FIG. 11C is a drawing for explaining a first example of an oxidization process shown in FIG. 8(C)

A first example of the oxidization process shown in FIG. 8(C) is radical oxidation. This first example can be adopted when the first example is adopted in the oxidization process shown in FIG. 6(B). In this case, when the sidewall surfaces of the trenches T₂ are radically oxidized, oxidizing species pass through the silicon oxide layer and a high-quality oxide layer is formed at the lower edges of the side surfaces σ₂. An example of an oxide layer (bird's beaks β₂) formed by the radical oxidization is shown in FIG. 11C. In this first example, the floating gate layer 122 is oxidized. However, as explained above, oxidization of the floating gate layer 122 as a polysilicon layer is not preferable. Nevertheless, since the lower edges of the side surfaces σ₁ are not oxidized in this embodiment, the disadvantage of the oxidization of the lower edges of the side surfaces σ₂ is not so significant. Therefore, in this first example, the floating gate layer 122 is oxidized with importance attached to the advantage of the oxidization of the lower edges of the side surfaces σ₂.

Figure 11D:
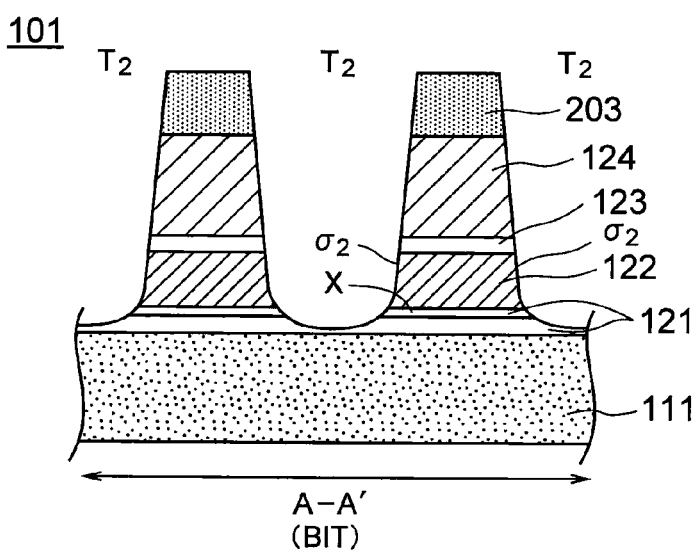
FIGS. 11D and 11E are drawings for explaining a second example of the oxidization process shown in FIG. 8(C)
Figure 11E:
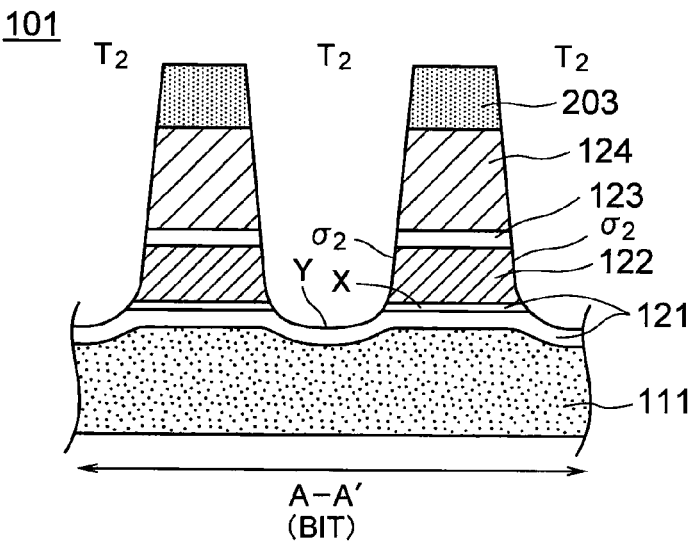

A second example of the oxidization process shown in FIG. 8(C) is bias oxidation. This second example can be adopted when the second example is adopted in the oxidization process in the oxidization process shown in FIG. 6(B). In this case, since the silicon nitride layer is formed on the surface of the first gate insulator 121, it is difficult to form bird's beaks at the lower edges of the side surfaces σ₂. On the other hand, the first gate insulator 121 located under the trenches T₂ is reduced in thickness by RIE performed for forming the trenches T₂ (FIG. 11D). In this case, when the substrate 111 is bias-oxidized, a large number of oxidizing species pass the thin portion of the first gate insulator 121. Thereby, the substrate 111 located under the trenches T₂ is selectively oxidized (FIG. 11E). Thereby, the thickness of the first gate insulator 121 located under the trenches T₂ increases, and the electric field concentration on the lower edges of the side surfaces σ₂ is relaxed. In FIG. 11E, the first gate insulator 121 located under the trenches T₂ is indicated by Y. In FIG. 11E, the first gate insulator Y is thick, and the upper surface and the lower surface of the first gate insulator Y are recessed in a direction of the substrate 111. This second example can be adopted as well when the first example is adopted in the oxidization process shown in FIG. 6(B).

In the manufacturing process shown in FIGS. 5(A) to 9(B), it is assumed that the oxidization process shown in FIG. 8(C) is performed by the radical oxidization. Referring back to FIG. 8(C), the explanation is continued.

Next, a post-oxide layer 141 is formed on the sidewall surfaces of the trenches T₂ by thermal oxidization. The post-oxide layer 141 in this embodiment is a silicon oxide layer. Next, ions are implanted into the substrate 111 by ion implantation. Next, the ions implanted in the substrate 111 are activated by thermal annealing. Thereby, an active region (source/drain regions) 151 is formed in the substrate 111 (FIG. 9(A)). In this way, a transistor is formed. As described above, FIG. 9(A) is an A-A' sectional view. A B-B' sectional view at the stage of FIG. 9(A) is shown in FIG. 9(B).

The oxidization process shown in FIG. 9(A) is performed for recovery from damage caused in the second gate insulator 123 by RIE (Reactive Ion Etching). In general, the oxidization process is referred to as post-oxidization process. In the post-oxidization process, in general, heat treatment is performed for several seconds at 800° C. to 1000° C. using an N₂ gas. The second gate insulator 123 is oxidized with a very small amount of residual oxygen by such high-temperature heat treatment. However, in such an oxidization process, the bird's beaks β₂ shown in FIG. 8(C) cannot be formed. Therefore, in this embodiment, the oxidization process shown in FIG. 8(C) is performed before the oxidization process shown in FIG. 9(A).

In this embodiment, concerning the oxidization processes shown in FIGS. 6(B) and 8(C), the oxidization process shown in FIG. 8(C) may be omitted.

As explained above, in this embodiment, concerning the side surfaces S₁ and σ₁ forming the sidewalls of the trenches T₁, the bird's beaks B₁ are selectively formed at the upper edges of the side surfaces S₁. Thereby, in this embodiment, it is possible to realize both the prevention of the electric field concentration by bird's beaks and the suppression of the disadvantage of bird's beaks.

(Curvature Radius of the Upper Edges of the Side Surfaces S₁)

A curvature radius of the upper edges of the side surfaces S₁ is explained. In FIG. 10, the curvature radius of the upper edges of the side surfaces S₁ in the side section in the word-line direction is indicated by "r".

Figure 12:
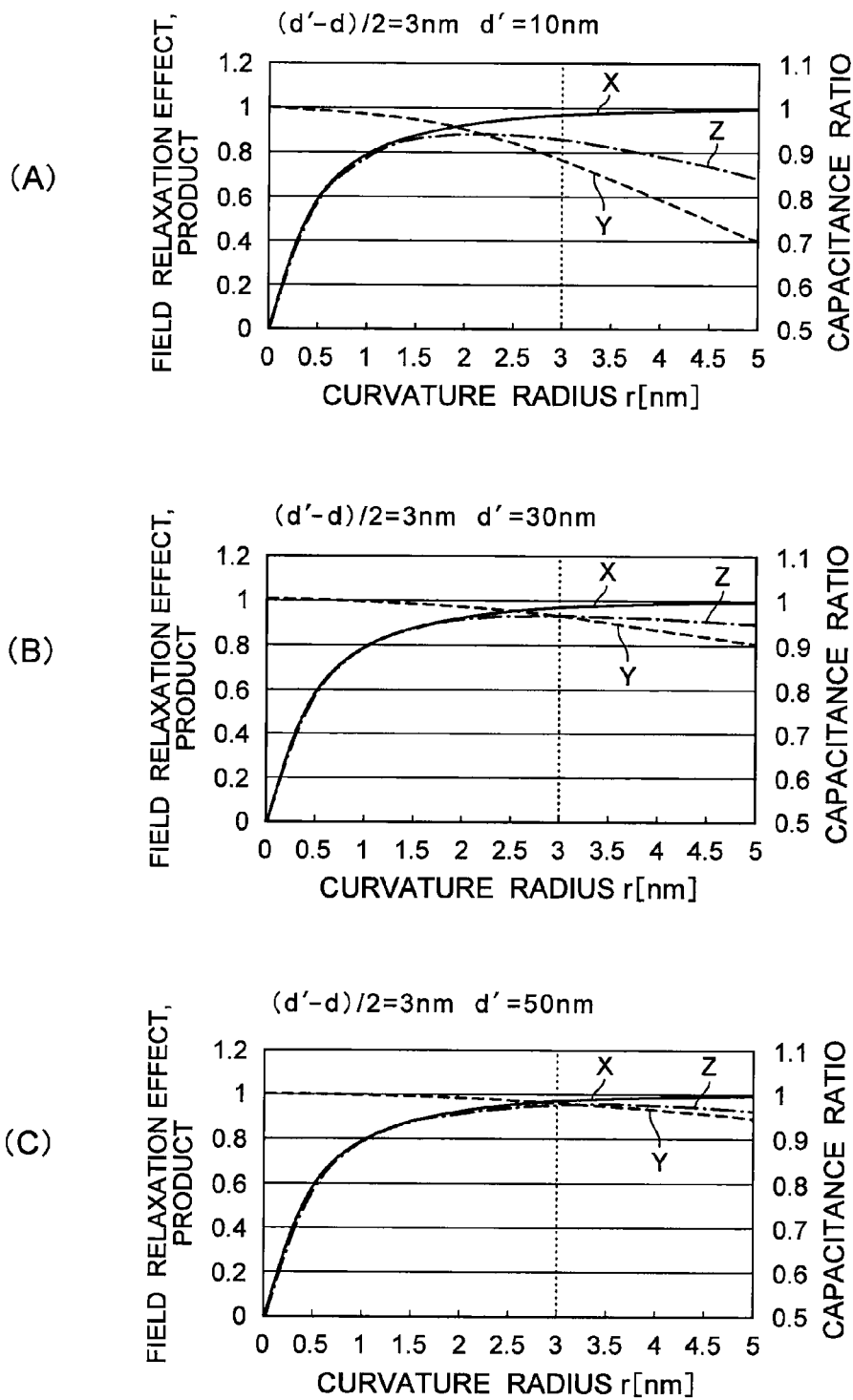
FIGS. 12(A) to 12(C) are graphs showing a field relaxation effect and a capacitance ratio.

FIGS. 12(A) to 12(C) are graphs showing a field relaxation effect and a capacitance ratio. In FIGS. 12(A) to 12(C), the field relaxation effect is indicated by X. The field relaxation effect is a value represented by 1−(E−Emin)/(Emax−Emin). Here, Emin represents an electric field of a flat portion of an interface between the substrate 111 and the first gate insulator 121. Further, Emax represents an electric field at edges of the interface in a case in which the bird's beaks B₁ are not formed. Further, E represents an electric field at the edges of the interface in a case in which the bird's beaks B₁ are formed. In FIGS. 12(A) to 12(C), the capacitance ratio is indicated by Y. The capacitance ratio is a value represented by C'/C. Here, C represents the capacitance of the first gate insulator 121 in a case in which the bird's beaks B₁ are not formed. Further, C' represents the capacitance of the first gate insulator 121 in a case in which the bird's beaks B₁ are formed. In FIGS. 12(A) to 12(C), a product of the field relaxation effect and the capacitance ratio is indicated by Z. In FIGS. 12(A) to 12(C), these values are indicated as functions of a curvature radius "r".

In FIGS. 12(A) to 12(C), three graphs are shown. FIG. 12(A) is a graph in a case in which "d'" is set to 10 nm. FIG. 12(B) is a graph in a case in which "d'" is set to 30 nm. FIG. 12(C) is a graph in a case in which "d'" is set to 50 nm. In all the cases, the thickness of the first gate insulator 121 is 8 nm, and an extrusive amount of the substrate 111 on one side, (d'−d)/2, is 3 nm. As explained above, "d" represents the width of the floating gate 122 and "d'" represents the width of the substrate 111 (active region 151) (see FIG. 10).

According to FIGS. 12(A) to 12(C), the field relaxation effect X increases with the curvature radius "r". However, the changing rate of the field relaxation effect X decreases from a point when the curvature radius "r" exceeds the extrusive amount (d'−d)/2. On the other hand, the change rate of the capacitance ratio Y increases from the point when the curvature radius "r" exceeds the extrusive amount (d'−d)/2. In this way, the field relaxation effect X and the capacitance ratio Y are in a tradeoff relation.

Therefore, the inventors calculated the product Z of the field relaxation effect X and the capacitance ratio Y in order to calculate an optimum value of the curvature radius "r". The inventors set, as an optimum value of the curvature radius "r", the curvature radius "r" that maximized the product Z. A calculation result of the optimum value of the curvature radius "r" is shown in FIG. 13.

Figure 13:
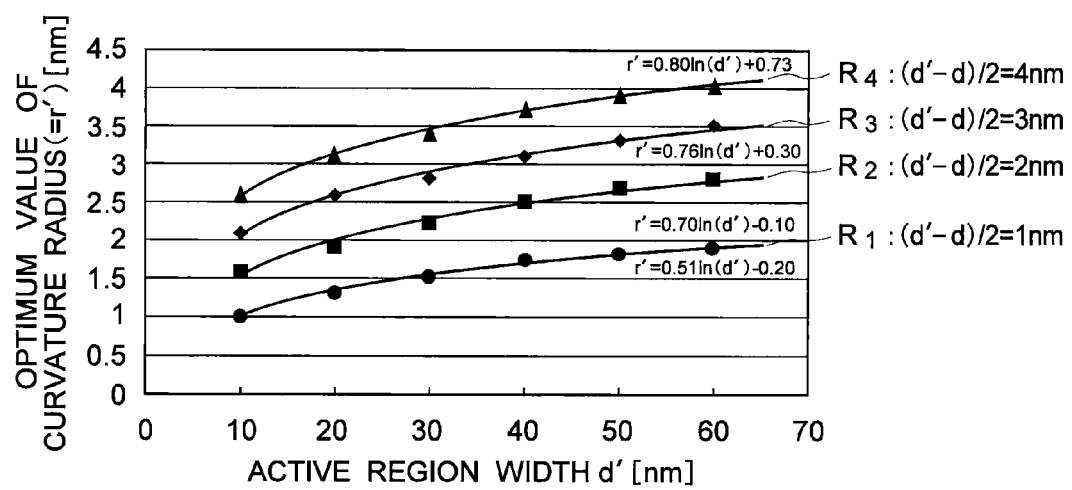
FIG. 13 is a graph showing a calculation result of an optimum value of a curvature radius.

FIG. 13 shows four curves $R_1$, $R_2$, $R_3$, and $R_4$. The curve $R_1$ represents a calculation result in a case in which the extrusive amount is 1 nm. The curve $R_2$ represents a calculation result in a case in which the extrusive amount is 2 nm. The curve $R_3$ represents a calculation result in a case in which the extrusive amount is 3 nm. The curve $R_4$ represents a calculation result in a case in which the extrusive amount is 4 nm. In FIG. 13, these results are shown as functions of the width "d'" of the active region 151.

In the following explanation, the optimum value of the curvature radius "r" is represented as "r'". It is seen from FIG. 13 that the optimum value "r'" increases with the extrusive amount. When the inventors evaluated this graph, it was found that the optimum value "r'" is substantially on a curve r'=a×ln(d')+b. Here, the coefficient "a" is represented by the following formula (1), the coefficient "b" is represented by the following formula (2), and ln represents a natural logarithm.

$$a = 0.18 \times \ln((d'-d)/2) + 0.55 \quad (1)$$

$$b = 0.09 \times ((d'-d)/2)^2 - 0.13 \times ((d'-d)/2) - 0.15 \quad (2)$$

It is desirable to set the curvature radius "r" to a value close to the optimum value "r'". According to the calculations and experiments by the inventors, the fluctuation in the product Z of the field relaxation effect X and the capacitance ratio Y is set within 5% by |r−r'| to be equal to or smaller than 1.6 nm (|r−r'|≦1.6 nm). This holds when "d'" is equal to or larger than 10 nm (d'≧10 nm). When the fluctuation in the product Z is set within 5%, it is relatively easy to set the fluctuation in threshold voltage of memory cells within a tolerance. Therefore, in this embodiment, in a case of d'≧10 nm and d'>d, the curvature radius "r" is determined such that |r−r'| is equal to or smaller than 1.6 nm (|r−r'|≦1.6 nm). Thereby, a suitable field relaxation effect and a suitable capacitance ratio are realized. FIG. 13 shows formulas of the optimum value "r'" in cases in which the extrusive amount on one side is 1, 2, 3, and 4 nm.

As explained above, according to the embodiment of the present invention, it is possible to provide means that can realize both the prevention of electric field concentration by bird's beaks and the suppression of the disadvantage of bird's beaks.

An example of a specific form of the present invention is explained above with reference to the embodiment of the present invention. However, the present invention is not limited to the embodiment.

The invention claimed is:

1. A semiconductor device having a bit line and a word line, the device comprising:
   a substrate which is provided with first trenches extending in a bit-line direction and has side surfaces forming sidewalls of the first trenches;
   a first gate insulator formed on the substrate between the first trenches;
   a floating gate formed on the first gate insulator between the first trenches and located between second trenches extending in a word-line direction, the floating gate having first side surfaces facing the first trenches and second side surfaces facing the second trenches;
   a second gate insulator formed on the floating gate between the second trenches; and
   a control gate formed on the second gate insulator between the second trenches,
   wherein the substrate includes bird's beaks which are provided at upper edges of the side surfaces of the substrate so that the bird's beaks are prevented from being provided at lower edges of the first side surfaces of the floating gate.

2. The device according to claim 1, wherein the floating gate includes bird's beaks provided at lower edges of the second side surfaces of the floating gate.

3. The device according to claim 1, wherein
   the first gate insulator includes a first portion located under the floating gate, and second portions located under the second trenches, and
   each of the second portions has an upper surface and a lower surface of the first which are recessed in a direction of the substrate with respect to an upper surface and a lower surface of the first portion, respectively.

4. The device according to claim 3, wherein
   the first portion includes a nitride layer forming the upper surface of the first portion.

5. The device according to claim 1, wherein each of the floating gate and the control gate is a polysilicon layer.

6. The device according to claim 1, wherein d'≧10 [nm], d'>d, and |r−r'|≦1.6 [nm] hold,
   where,
   "d" represents a width of a lower surface of the floating gate in a side section in the word-line direction,
   "d'" represents a width of an upper surface of an active region of the substrate in the side section in the word-line direction,
   "r" represents a curvature radius of the upper edges of the substrate in the side section in the word-line direction, and r'=a×ln(d')+b, a=0.18×ln((d'−d)/2)+0.55, b=0.09×((d'−d)/2)²−0.13×((d'−d)/2)−0.15, and "ln" represents a natural logarithm.

* * * * *